United States Patent [19]
Dieny et al.

[11] Patent Number: 6,013,365
[45] Date of Patent: Jan. 11, 2000

[54] MULTI-LAYER STRUCTURE AND SENSOR AND MANUFACTURING PROCESS

[75] Inventors: Bernard Dieny, Seyssinet; Stéphane Auffret, Vaulnaveys-Le-Haut; Christophe Cowache; Franck Berthet, both of Seyssinet, all of France

[73] Assignee: Commissariat A L'Atomique, Paris, France

[21] Appl. No.: 08/760,798

[22] Filed: Dec. 5, 1996

[30]   Foreign Application Priority Data

Dec. 15, 1995 [FR] France ................................. 95 14898

[51] Int. Cl.$^7$ ....................................................... G11B 5/66
[52] U.S. Cl. ......................... 428/332; 428/336; 428/611; 428/660; 428/668; 428/673; 428/675; 428/694 R; 428/694 TR; 428/694 T; 428/694 TS; 428/694 TM; 428/692; 427/128; 427/129; 427/130; 204/192.12; 204/192.2; 360/113; 324/252
[58] Field of Search ..................................... 428/611, 332, 428/336, 660, 668, 673, 675, 694 R, 694 TS, 694 TM, 800, 694 TR, 692, 694 T; 427/128–130; 204/197.12, 192.2; 360/113; 324/252

[56]         References Cited

U.S. PATENT DOCUMENTS 5,549,978   8/1996   Iwasaki .................................... 428/692

FOREIGN PATENT DOCUMENTS 2 698 965   6/1994   France .
2 710 753   4/1995   France .
2 712 420   5/1995   France .

OTHER PUBLICATIONS

B. Dieuy, "Giant Magnetoresistance in Spin–Valve Multi-layer" JMMM, 136 (1994) 335–359.

Giant Magnetoresistance in Spin–Valve Multilayers, B. Dieny, Journal of Magnetism and Magnetic Materials, pp. 335–359, 1994.

Magnetoresistance Properties and Thermal Stability of Ni–Fe/Ag Multilayers, B. Rodmacq et al. Journal of Magnetism and Magnetic Materials, pp. L11–L16, 1993.

Giant Magnetoresistance of (001) Fe/(001) Cr Magnetic Superlattices, M. N. Baibich et al, Physical Review Letters, vol. 61, No. 21, pp. 2472–2475, Nov. 1988.

Patent Abstracts of Japan, vol. 17, No. 383, (E–1400), Jul. 19, 1993 JP–5–067525, Mar. 19, 1993.

Journal of Magnetism and Magnetic Materials, vol. 140/144, Part 1, pp. 495–496, L.B. Steren, et al., "Giant Magnetoresistance in Hybrid Magnetic Nanostructures", Feb. 1995.

Journal of Crystal Growth, vol. 111, No. 1/4, pp. 1003–1010, May 2, 1991, P. Etienne, et al., "Molecular Beam Epitaxial Growth of CR/FE, AG/CR, and AG/CO Superlattices on MgO (001) Substrates".

Journal of Magnetism and Magnetic Materials, vol. 140/144, pp. 609–610, Feb. 1, 1995, E.A.M. Van Alphen, et al., "Influence of Annealing on the Structural and Magnetic Properties of CO/AG Multilayers with Thin CO Layers".

(List continued on next page.)

*Primary Examiner*—Leszek Kiliman
*Attorney, Agent, or Firm*—Oblon, Spivak, McClelland, Maier & Neustadt, P.C.

[57]            ABSTRACT

This invention relates to a multilayered magnetic structure comprising an alternate stack of:

layers (6, 16) of a first type based on magnetic materials,
  layers (12) of a second type, made of Ag or an Ag rich alloy,
  a thin interface layer (8, 14) of Co or a Co rich alloy being located at the interface between layers of the first type and layers of the second type.

The invention also relates to a process for making this type of structure.

Applications to sensors based on magnetoresistive effects, such as current sensors or magnetic heads.

31 Claims, 5 Drawing Sheets

OTHER PUBLICATIONS

IEEE Transactions of Magnetics, vol. Mag–11, No. 4, pp. 1039–1050, Jul. 1975, David A. Thompson, et al., "Thin Film Magnetoresistors in Memory, Storage, and Related Applications".

IEEE Translation Journal of Magnetics in Japan, vol. 7, No. 9, pp. 674–684, Sep. 1992, H. Yamamoto, et al., "Magnetoresistance of Multilayers".

Journal of Magnetism and Magnetic Materials, vol. 136, pp. 335–357, 1994, B. Dieny, "Giant Magnetoresistance in Spin–Valve Multilayers".

Journal of Magnetism and Magnetic Materials, vol. 126, pp. 604–507, M. Satomi, et al., "Thermal Stability of Magnetoresistance in Ni–Fe–Co/Cu(/Co) Superlattices", 1993.

B. D. Cullity, "Introduction to Magnetic Materials", pp. 529; 644, Table 13.6, 1972.

MULTI-LAYER STRUCTURE AND SENSOR AND MANUFACTURING PROCESS

TECHNICAL FIELD

This invention generally relates to field detectors or magnetic flux detectors, and particularly to magnetoresistive sensors. Magnetoresistive sensors are used for example in magnetic recording to read information recorded on a magnetic information storage medium. More generally, the type of microsensor described in this invention relates to the detection of weak magnetic fields (typically within the range of 0.1 Oe to a few 10 s of Oe, i.e. from a few A/m to a few thousand A/m) Other application examples include determination of the electric current carried out by a conductor by measuring the magnetic field close to this conductor, position sensors (translation or rotation) or magnetoresistive compasses.

STATE OF THE ART

Until 1990, magnetoresistive sensors used for the detection of weak magnetic fields, particularly for use in magnetic recording, were based on the anisotropic effect of magnetoresistance. A detailed description of this effect is given in the article by D. A. Thompson et al., IEEE Trans. Mag. Mag-11, p. 1039 (1975). This effect is present in ferromagnetic transition metals (alloys based on Ni, Co, Fe), and consists of changing the resistivity of the magnetic material as a function of the angle between the measured current passing through the magnetoresistive element and the material magnetization. The relative change in the resistivity of the magnetic material ($\Delta\rho/\rho$) may be as high as 4 to 5% at ambient temperature in fields of the order of 1 kA/m, in massive ferromagnetic transition metals. However, this amplitude drops to 1 or 2% when the same materials are deposited in thin layers of the order of 15 to 30 nanometers thick. This thickness range is used in modern magnetoresistive sensors. Therefore the sensitivity of these sensors is limited. Furthermore, their response is not linear due to the fact that the variation of resistivity is proportional to the square of the cosine of the angle between the current and the magnetization.

In 1989, giant magnetoresistance effects were discovered in multi-layers (Fe 3 nm/Cr 0.9 nm)$_n$ and subsequently in many other multi-layered systems formed from an alternation of layers of ferromagnetic transition metals and layers of non-magnetic metal. In these systems, the magnetoresistance effect is related essentially to a change in the relative orientation of the magnetization in successive ferromagnetic layers. This effect is called "giant magnetoresistance" or "spin-valve effect" in the literature. Reviews on these multi-layer materials with giant magnetoresistance have been published by H. Yamamoto and T. Shinjo, IEEE Translation Journal on Magnetics in Japan, vol. 7, No. 9, September 1992 and by B. Dieny, Journal of Magnetism and Magnetic Materials 136 (1994) 335.

Patent FR-2 698 965 entitled "multi-layer magnetic structure and sensor with high magnetoresistance, and structure manufacturing process" describes a particular multi-layer system based on alternating layers of Permalloy (Ni and Fe based alloy with a composition similar to Ni$_{80}$Fe$_{20}$) with a thickness of the order of 1 to 2 nm, and Ag (thickness from 1 to 2 nm). For this thickness of Ag, there is an antiferromagnetic coupling between the Permalloy layers through the Ag layers. When this material is prepared by cathodic spraying and the substrate is kept at a low temperature during deposition (liquid nitrogen), it has very good structural magnetic and magnetoresistive properties which make it particularly useful for applications. It has good sensitivity in terms of the slope of the relative variation of the resistance R as a function of the field H to be measured $$\left(\frac{d\left(\frac{\Delta R}{R}\right)}{dH} \text{ of the order of 0.1 to 0.2\%/Oe}\right),$$

good linearity of the response over a wide range of fields to be measured (of the order of 1 to a few 10 s of Oe). Furthermore, this material provides good thermal stability up to temperatures of the order of 250° C., due to the immiscibility of NiFe and the Ag. However, the properties of the material deteriorate if annealing is done at temperatures exceeding 250° C. However it is quite possible that the material could be heated above 250° C. (up to 300° C.) for several minutes with technological lithography processes used in microelectronics for the manufacture of magnetic field microsensors. The purpose of this invention is to improve the thermal stability of the multi-layered material, and to ensure that its properties are not worse than they were in the raw deposited state, or are possibly improved, after exposure to temperatures up to 300° C.

DESCRIPTION OF THE INVENTION

Therefore the problem solved by this invention is to increase the thermal stability of the magnetoresistive material used in magnetoresistive sensors as much as possible, while maintaining good sensitivity of the material in weak fields. The increased thermal stability will also give a longer material life, and particularly better resistance to electromigration.

Thus the purpose of the invention is a magnetic layered structure comprising an alternate stack of:
- layers of a first type, based on magnetic materials,
- layers of a second type, made of Ag or an Ag rich alloy,
- a thin interface layer of Co or a Co rich alloy being located at the interfaces between layers of the first type and layers of the second type.

The effect of inserting the interface layer is to very significantly increase the structural stability of the material when subjected to annealing at up to 300° C. for 20 minutes. A comparison of the effect of annealing a multi-layer with composition (NiFe 2.5 nm/Ag 1.1 nm)$_{20}$ and (Co 0.2 nm/NiFe 2.5 nm/Co 0.2 nm/Ag 1.1 nm)$_{20}$ for 20 minutes at 300° C. shows that the magnetoresistive properties of the first structure (without Co at interfaces) are very much degraded during annealing, whereas the magnetoresistive properties of the second structure are unchanged. Furthermore, the magnetoresistance amplitude is also increased by the addition of a thin layer of Co at the interfaces. The magnetoresistance amplitude is doubled in structures with composition (NiFe 2.5 nm/Ag 1.1 nm)$_{10}$ by adding 0.25 nm of Co at the interfaces.

Preferably, the stack shall include at least two layers of the first type and one layer of the second type.

Furthermore, a Co layer may also be inserted on each side of the stack.

The stack may include different layers of the first type and/or different layers of the second type.

Furthermore, a layer based on magnetic materials means a layer satisfying the generic formula Ni$_{100-x-y-z}$Co$_x$Fe$_y$A$_z$ where $0 \leq x < 100$, $0 \leq y < 100$ and $0 \leq z \leq 40$, and $0 \leq x+y+z \leq 100$ and A is an element or an arbitrary set of elements. Examples of materials satisfying this formula include permalloy, mu-metal, supermalloy, sundust, etc.

The formula for a silver rich alloy for layers of the second type may be Ag$_x$Cu$_{1-x}$ or Ag$_x$Au$_{1-x}$ where $0 < x < 0.5$. Pure silver apparently gives the best thermal stability, but the addition of copper or even better gold, can reduce the field at the saturation of the device, and therefore increase its sensitivity.

Preferably, the thickness of the interface layer will he between a fraction of an atomic plane and a few atomic planes.

The thickness for layers of the second type may be such that there is an anti-ferromagnetic coupling between the layers of the first type through layers of the second type and the interface layers.

For example, the thickness of layers of the second type may be between 0.8 and 1.5 nm.

According to another aspect, in some applications the thickness of the second type of layer may be such that there is no, or only very weak, anti-ferromagnetic coupling between layers of the first type.

Another purpose of the invention is a process or making a layered magnetic structure including the following steps:

deposit layers of the first type, based on magnetic materials, deposit layers of the second type, made of Ag or an Ag rich alloy, formation of a thin interface layer of Co or a Co rich alloy at interfaces between layers of the first type and layers of the second type.

Layers may be deposited by condensation of metal vapors on a substrate, at a temperature below the ambient temperature. For example, the deposit may be done by cathodic spraying.

Another purpose of the invention is a multi-layer sensor with a magnetoresistive effect comprising a layered magnetic structure such as that described above.

Thus, another purpose of the invention is a current sensor designed to measure the current passing through an electric conductor consisting of a magnetoresistive tape surrounding the conductor and the ends of which will be connected to a current measurement device, the tape having a layered magnetic structure such as that described above.

BRIEF DESCRIPTION OF THE FIGURES

In any case, the characteristics and advantages of the invention will become clearer from the following description. This description concerns examples of embodiments given as examples but which are not restrictive, referring to drawings attached to the appendix in which.

DETAILED DESCRIPTION OF EMBODIMENTS

A first example of the structure according to the invention has the following composition: substrate/buffer layer/(Py $ep_y$/X $e_x$/(Ag $e_{Ag}$/X $e_x$/Py $ep_y$/X $e_x$)$_n$/Ag $e_{Ag}$/X $e_x$/Py $ep_y$/ cover layer.

Figure 1:
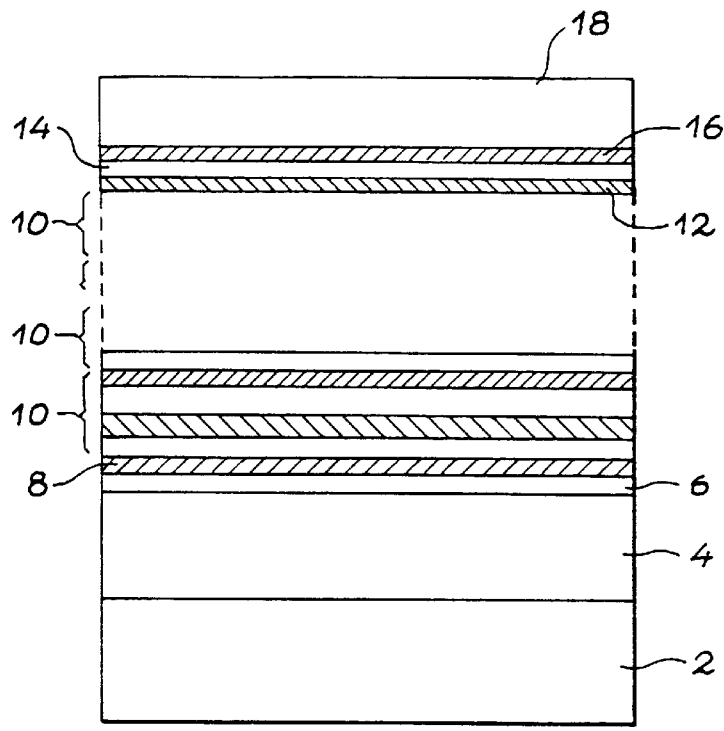
FIG. 1 shows a multi-layered structure according to the invention.

This type of structure is shown schematically in FIG. 1, in which references 2 and 4 refer to the substrate and the buffer layer respectively. References 6 and 8 refer to a first layer Py and a layer X, also called the interface layer, respectively. The Ag/X/Py/X assembly is globally referred to as reference 10. This assembly or pattern may be repeated n times.

References 12, 14 and 16 refer to a final layer of silver, an interface layer X and a final layer Py on which a cover layer 18 is deposited, respectively.

For example, substrate 2 may consist of intrinsic or slightly doped Si (so that it does not conduct too much compared with the multilayer and therefore does not shunt the current), glass, Kapton, an oxide such as MgO, etc. The purpose of buffer layer 4 is to improve the structural quality of the material during its growth. For example, it may be made of tantalum a few nanometers thick (for example 5 nm.)

Py refers to an alloy of the family of alloys with composition $Ni_{100-x-y-z}Co_xFe_yA_z$, and preferably a Permalloy or mu-metal type alloy. There are a number of alternatives of Permalloy and mu-metal with a composition similar to $Ni_{80}Fe_{20}$, with the possibility of adding a third or fourth element such as Co or Mo. Most of these materials are characterized by soft magnetic properties (low hysteresis, coercive field of the order of a few Oe or less), low saturation field (about 10 Oe (800 A/m) or less), high permeability (several hundreds) and may be used in the proposed structure.

In the general formula $Ni_{100-x-y-z}Co_xFe_yA_z$, x+y+z is preferably between 0 and 40, x is between 0 and 30, y is between 0 and 30, and z is between 0 and 20. A is a single element or several elements, for example such as Cu, Cr, Mo, V, B which are sometimes added in small quantities as additives in the composition of high permeability alloys (Permalloy, mu-metal, Supermalloy, etc.). Examples of these alloys are given in "Introduction to magnetic materials, Cullity, Addison-Wesley Publishing Company, 1972, p. 529, table 13.6).

$eP_y$ is the thickness of these Permalloy layers (for example layers 8, 16 in FIG. 1). It can vary between 1 and 20 nm and preferably is between 1.5 and 5 nm. These thicknesses must be of the same order of magnitude or less than the free average electronic paths in these materials, (which are of the order of about 10 nm). Furthermore, the maximum magnetoresistance is obtained at a $P_y$ thickness of about 2.2 nm, the best sensitivity is obtained for thicknesses exceeding 6 nm whereas the thermal stability degrades starting from about 5 nm. This is why the thickness of $P_y$ will preferably be between 1.5 and 5 nm.

Figure 3A:
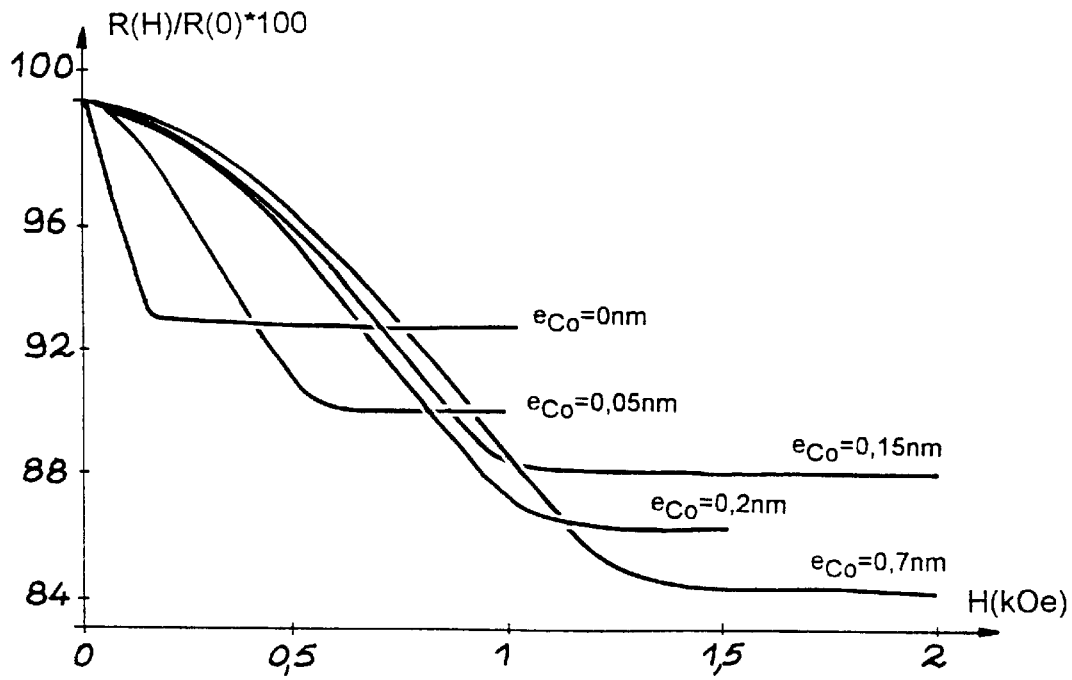
FIGS. 3A and 3B show the variation of magnetoresistance as a function of the Co thickness.
Figure 3B:
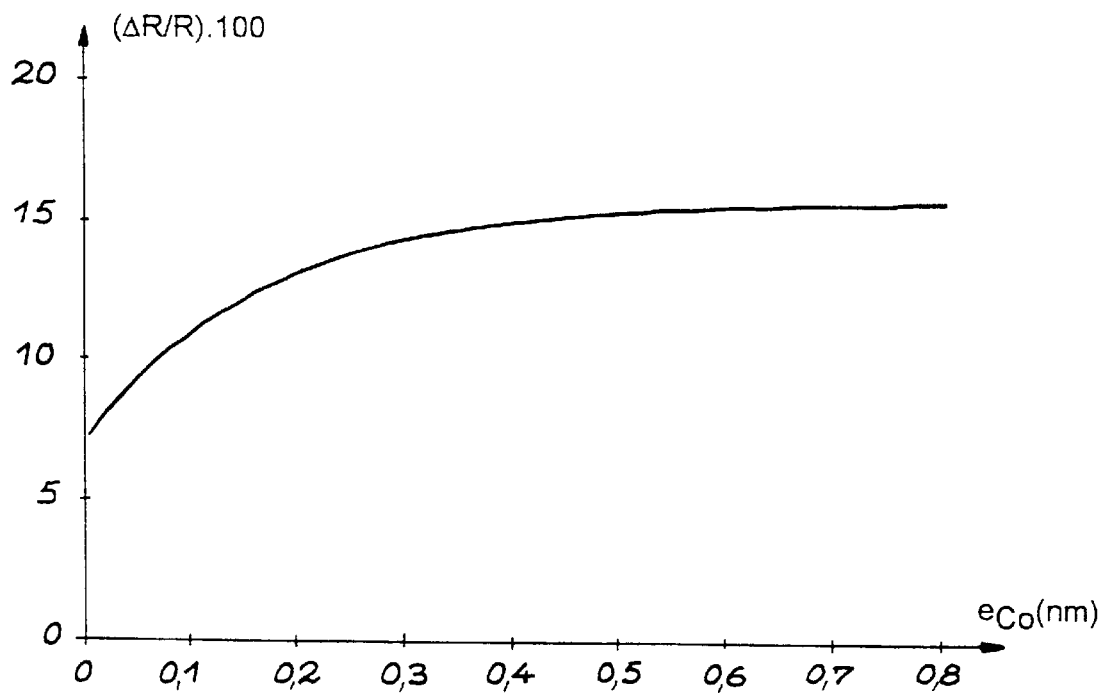
Figure 3:
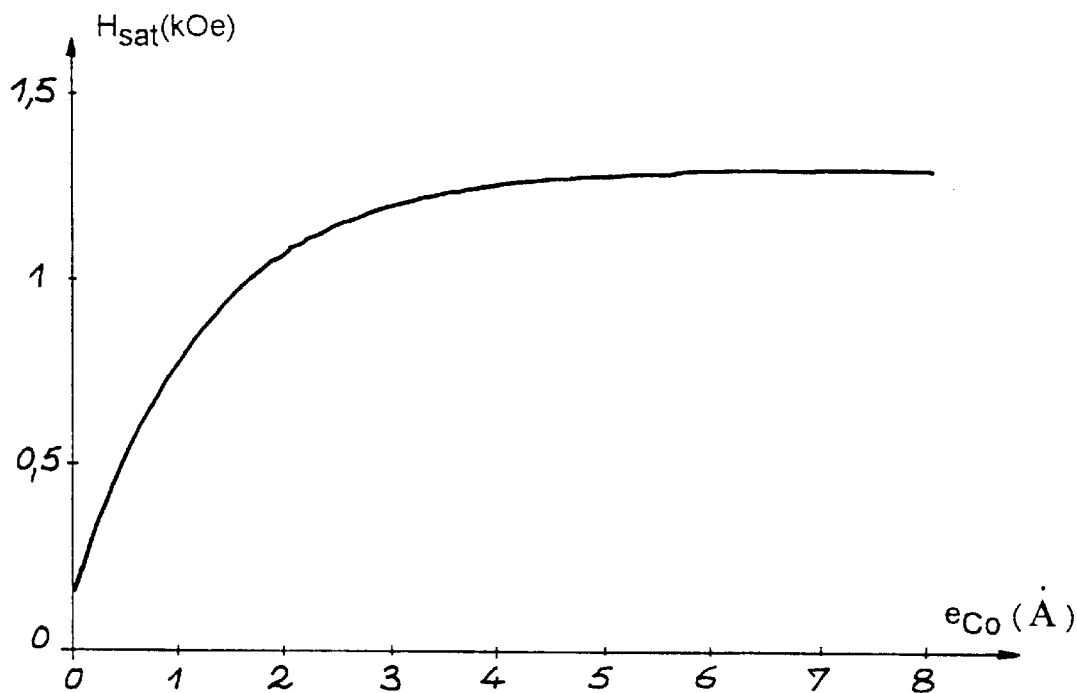
FIG. 3C shows the variation of the saturation field as a function of the Co thickness.
Figure 4:
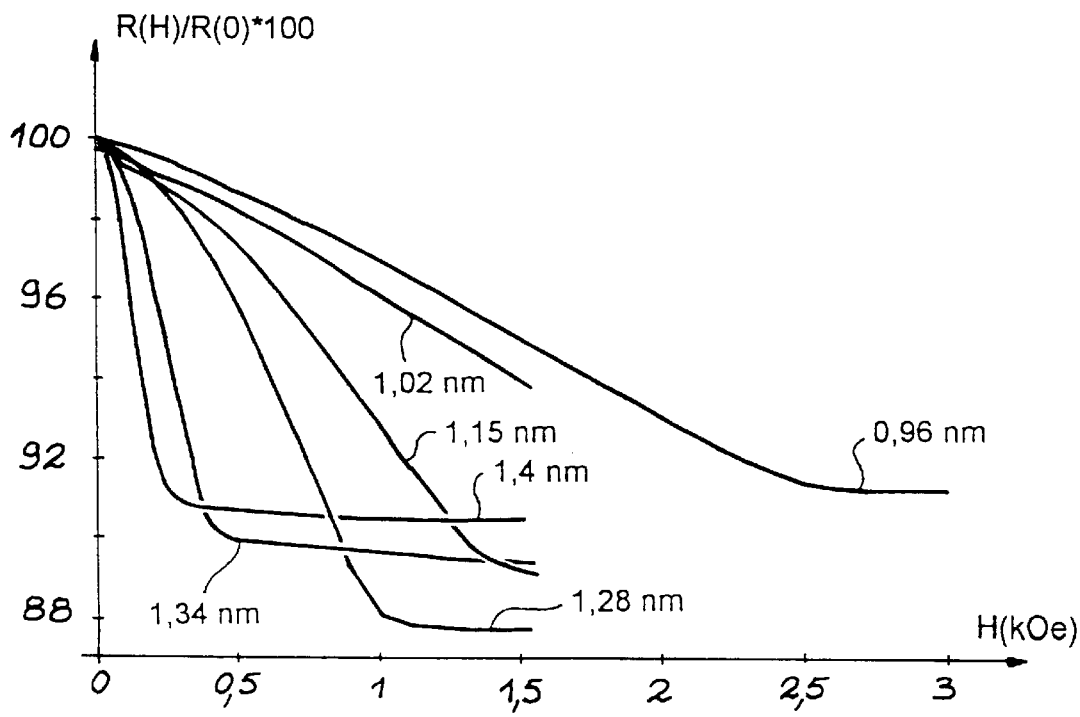

X refers to the thin interface layer introduced at interfaces between Permalloy and Ag (for example layers 8 and 14 in FIG. 1). X may be made of Co or a Co rich alloy (for example $Co_{90}Fe_{10}$ or $Co_{70}Fe_{30}$). $e_x$ is the thickness of this interface layer. It may vary from a fraction of an atomic plane to several atomic planes (for example, 2, 3 or 4 planes) and is preferably about 1 atomic plane (0.25 nm). FIGS. 3B and 3C show that one atomic plane of Co is sufficient to obtain a significant increase in giant magnetoresistance ard thermal stability. Using more than one atomic plane of Co tends to quite significantly increase the saturation field, and therefore reduce the material sensitivity.

$e_{Ag}$ is the thickness of the silver layers. This thickness is preferably such that there is antiferromagnetic coupling between the Permalloy layers through the Ag layers. This condition is satisfied for Ag thicknesses of between about 0.9 and 1.3 nm.

n is the number of multilayer periods without counting external Py layers (n may vary from 0 to any integer value, but is typically between 0 and 50 for magnetic recording applications).

The cover layer 18 prevents the structure from oxidation. For example, it may be made of Ta.

Various grades may be added to with the composition proposed above. For example, a thin interface layer may be added between the buffer layer and the first layer of Py and/or between the last layer of Py and the cover layer, or a layer of Ag may be deposited after the buffer layer, or a finishing layer of Ag may be deposited before the cover layer.

Another example of a structure according to the invention is of the "spin-valve" type based on Ag. Simple spin-valve structures such as NiFe (6 to 8 nm)/Cu (2 to 4 nm)/NiFe (3 to 6 nm)/FeMn (7 to 12 nm) have very attractive magnetoresistive properties for magnetic recording applications. The same is true for dual spin valves such as NiO (5 to 10 nm)/NiFe (3 to 6 nm)/Cu (2 to 4 nm)/NiFe (6 to 8 nm)/Cu (2 to 4 nm)/NiFe (3 to 6 nm)/FeMn (7 to 12 nm). The problem with these structures is tile relatively poor resistance to annealing due to the presence of the NiFe/Cu interfaces. Since the Permalloy and the Cu are miscible, these two materials tend to diffuse into each other during annealing, which degrades their magnetoresistive properties.

Therefore the invention also relates to a spin-valve structure with the following composition: substrate/buffer layer/ Py (5 to 10 nm) X $e_x$/Ag (2 to 4 nm)/X $e_x$/Py (3 to 6 nm)/antiferromagnetic layer (for example FeMn 7 to 12 nm)/cover layer. The substrate, the buffer layer, the cover layer, the thin interface layer have the same characteristics as were described for the first proposed structure. The purpose of the antiferromagnetic layer is to trap the exchange of magnetization of the adjacent Py layer by anisotropy.

A third structure according to the invention, similar to the second, is a dual spin-valve with the following composition: substrate/buffer layer/antiferromagnetic layer (for example 5 to 10 nm of NiO)/NiFe (3 to 6 nm) X $e_x$/Ag (2 to 4 nm)/X $e_x$/NiFe (6 to 8 nm)/X $e_x$/Ag (2 to 4 nm)/X $e_x$/NiFe (3 to 6 nm)/antiferromagnetic layer (for example 7 to 12 nm FeMn)/cover layer.

Figure 2A:
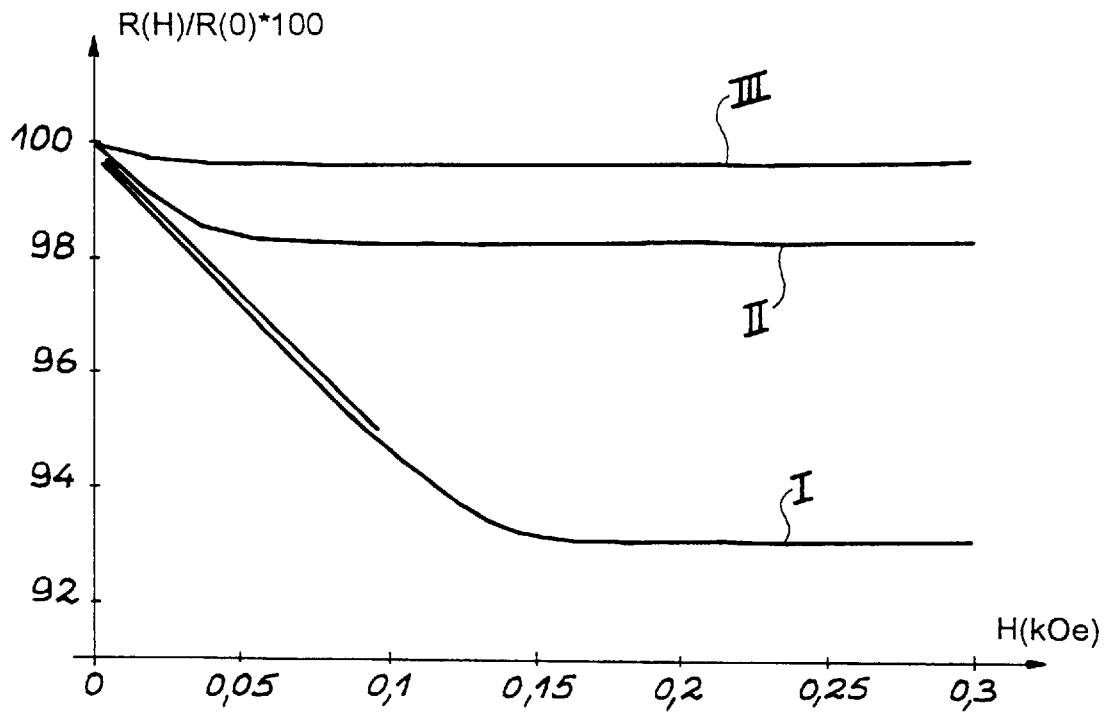
FIGS. 2A and 2B show the magnetoresistance of a multi-layer according to prior art and according to the invention, respectively.
Figure 2B:
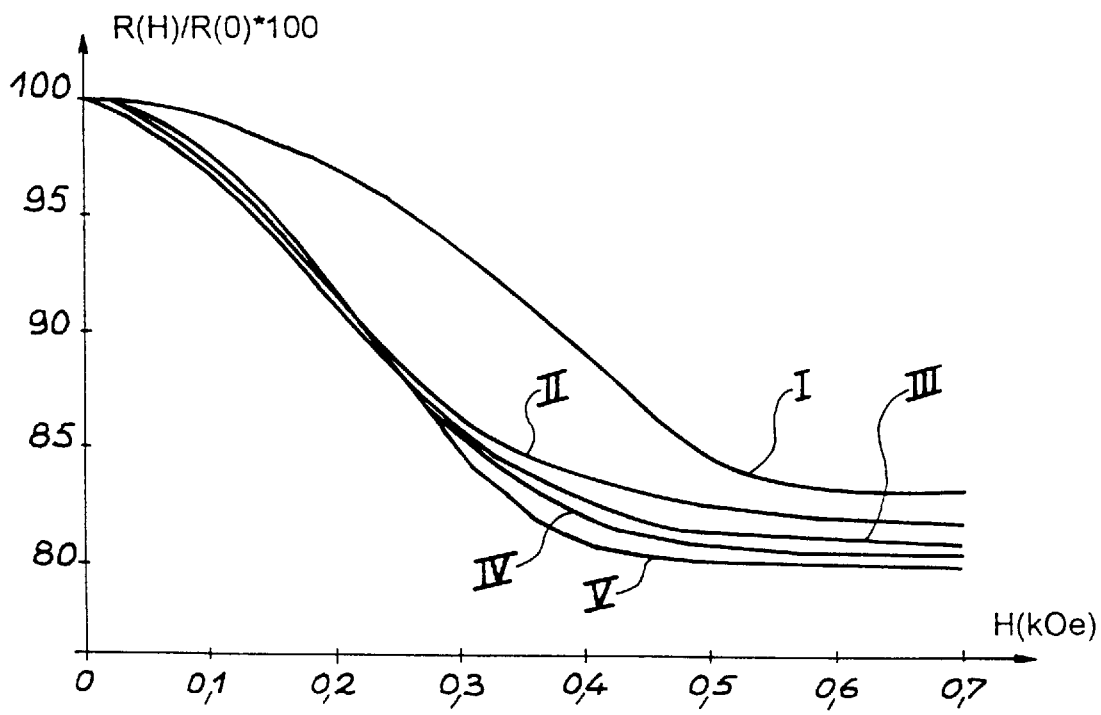

FIGS. 2A and 2B illustrate the increase in the stability of the properties of these structures for annealing between 250° C. and 300° C., related to the addition of thin interface layers of Co at Py/Ag interfaces. FIG. 2A shows the magnetoresistance of a multilayer with a composition Si substrate/ SiO$_2$/(Ni$_{80}$Fe$_{20}$ 2.5 nm/Ag 1.1 nm)$_{20}$ as deposited (curve I), after annealing at 275° C. for 20 minutes (curve II), and at 290° C. for 20 minutes (curve III). On these figures, the magnetoresistance is represented by $$\frac{R(H)}{R(O)} \times 100,$$

which corresponds to $$\left(\frac{\Delta R}{R} + 1\right) \cdot 100.$$

Note that the magnetoresistance amplitude was considerably reduced under the effect of these annealing operations. By comparison, FIG. 2B shows that the magnetoresistance of a multilayer with the following composition: Si substrate (Co 0.3 nm/Ni$_{80}$Fe$_{20}$ 1.9 nm/Co 0.3 nm/Ag 1.1 nm)$_{20}$ as deposited (curve I), and after successive annealing operations (curves II–V) at increasing temperatures for 20 minutes. Note that the magnetoresistance increased above the as-deposited state (curve I) after annealing at 275° C. (curve V), whereas the saturation field is reduced. It can be seen that after annealing, the magnetoresistance no longer changes for lower values of the field (saturation field). The magnetoresistance amplitude reduces slightly above 275° C. and up to 310° C. (curve II for 310° C.; curve III for 300° C.; curve IV for 290° C.), but does not drop sharply as in the case in FIG. 2A (without Co at interfaces). Furthermore, as the saturation field continues to drop below 275° C., the $$\frac{R(H)}{R(O)} \times 100$$

curves between 275° C. and 310° C. are practically superimposed for fields of the order of ⅔ of the saturation field. Therefore a comparison of FIGS. 2A and 2B shows the increased stability of the magnetoresistive properties of the material during annealing operations, at least up to 300° C., due to the addition of thin layers of Co at the Permalloy/Ag interfaces.

Similarly the addition of thin layers of Co at Permalloy/ Ag interfaces increases the magnetoresistance amplitude of the material. This is illustrated in FIGS. 3A and 3B. FIG. 3A represents the family of $$\left[\frac{R(H)}{R(O)} \times 100\right]$$

curves obtained for different samples corresponding to increasing thicknesses $e_{Co}$ (in nm) of the Co interface layers. The composition of these samples is: substrate Si/SiO$_2$/(Co $e_{Co}$/Ni$_{80}$Fe$_{20}$ (2.5-2$e_{Co}$) nm/Co $e_{Co}$/Ag 1.1 nm)$_{10}$.

In this experiment, the total thickness of the Co/NiFe/Co magnetic layers has been kept constant to facilitate the comparison between the different samples. A very fast increase in the magnetoresistance amplitude can be seen in FIG. 3A, related to the addition of Co interface layers.

FIG. 3B shows the magnetoresistance amplitude as a function of the thickness $e_{Co}$ of Co layers. The curve shown as a solid line is an adjustment based on an exponential phenomenological law:

$$\frac{\Delta R}{R} = M_R = 7.2 + 8.5(1 - \exp(-e_{Co}/0.16)),$$

where $e_{Co}$ is expressed in nanometers and $M_R$ in %.

This curve shows that the magnetoresistance amplitude increases very quickly at low thicknesses, and practically saturates when a single atomic layer of Co was introduced at interfaces. Therefore adding an atomic plane of Co at Permalloy/Ag interfaces is sufficient to double the amplitude of the magnetoresistance and to improve the thermal stability of the structure.

Unfortunately, the saturation field also increases with the thickness of the Co interface layers. This is clearly visible in FIG. 3A. The saturation field is plotted as a function of the Co thickness in FIG. 3C. The curve shown as a solid line represents the following equation:

$$H_{sat}(kOe) = 0.156 + 1.15 \, (1 - \exp(e_{Co}/0.12)),$$

where $e_{Co}$ is expressed in nanometers and $H_{sat}$ is in kOe.

Figure 4B:
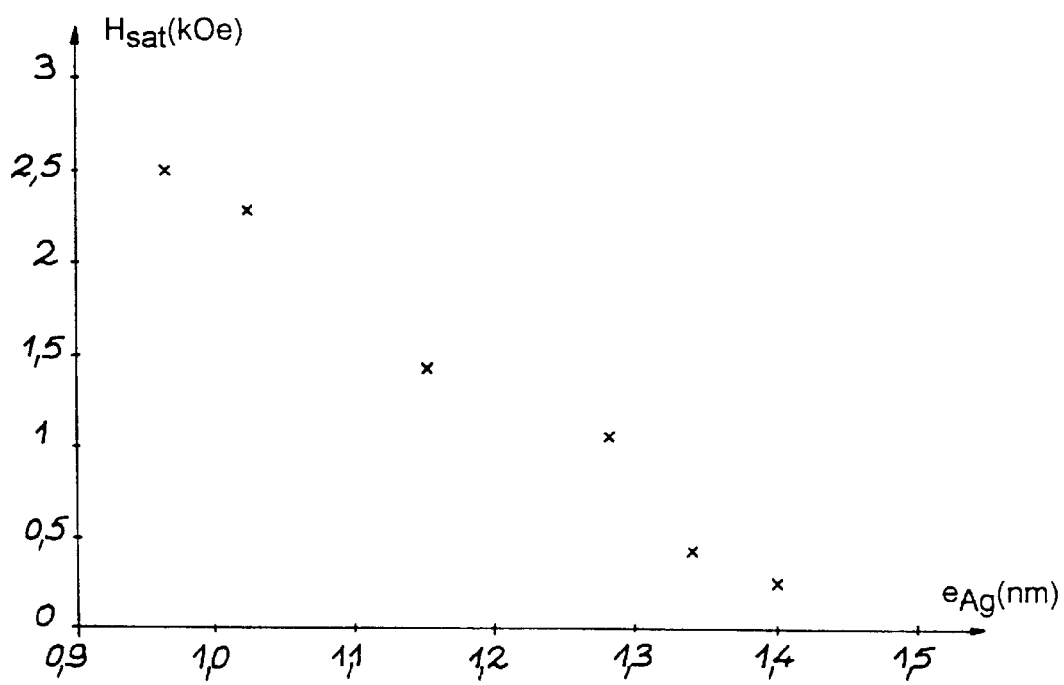
FIGS. 4A and 4B show the variation of the magnetoresistance and the magnetic saturation field as a function of the thickness of the silver layer, FIG. 5 schematically shows an application of the invention to a current sensor.

The $H_{sat}$ field increases a little less quickly than the magnetoresistance amplitude as a function of the Co thickness. However, this saturation field can be reduced by varying the thickness of Ag. This is illustrated in FIG. 4A which shows a family of $$\frac{R(H)}{R(O)} \times 100$$

curves obtained for different samples corresponding to increasing thicknesses $e_{Ag}$ of the Ag layers. The composition of these samples is Si substrate/(Co 0.2 nm/Ni$_{80}$Fe$_{20}$ 2.1 nm/Co 0.2 nm/Ag $e_{Ag}$)$_{10}$. A very large variation of the saturation field is observed as a function of the Ag thickness. Coupling between Permalloy layers with Co at interfaces through the Ag is antiferromagnetic for Ag thicknesses between about 0.9 nm to 1.45 nm. The saturation field is at a minimum towards the upper end of this Ag thickness range, i.e. at about 1.3 to 1.4 nm of Ag. This is illustrated in FIG. 4B, which shows saturation field variations as a function of the thickness of Ag. The preferred thickness of Ag to be used for the best possible sensitivity ΔR/R(H) is therefore of the order of 1.3 to 1.4 nm.

The results presented in this application are surprising for the following reasons.

Firstly, it is known that annealing of structures consisting of multilayers (Co/Ag) in which the Co layers are very thin (of the order of a few atomic planes thick) leads to coalescence of Co islands. These layers, initially continuous in the as-deposited state, become dislocated during annealing operations. The Co coalesces in the form of islands which increase in size and become more widely spaced as annealing continues. For example, this process is described in the publication by E. A. M., Van Alphen, P. A. A. Vander Heijden, W. L. M de Jonge, Journal of Magnetism and Magnetic Materials 140–144 (1995) 609. Considering this effect, the expert in the field would not be likely to use Co at NiFe/Ag interfaces, since he would expect a similar coalescence to occur at the interfaces. If this were the case, there would then be a discontinuous interface consisting of NiFe/Ag in some locations, and NiFe/Co/Ag at other locations. The locations without Co would be points of weakness for the thermal stability of the multilayers. However, the experimental results obtained (comparison of FIGS. 2A without Co at interfaces, and 2B with Co at interfaces) show that the thermal stability is clearly and significantly increased by adding Co at interfaces. This implies that the layer of Co introduced at the interface may be considered as being continuous, and therefore that the coalescence of Co in the form of islands is globally negligible or zero. This difference in the behavior of thin layers of Co between the (Co/Ag) system and the system with NiFe/Co/Ag interfaces is undoubtedly due to the differences in interface energy between the NiFe/Co and Co/Ag interfaces.

Another problem that could have occurred during annealing operations on Permalloy/Ag multilayers with Co at interfaces is due to the miscibility of Permalloy and Co. The annealing operation done could have caused diffusion of Co inside the Permalloy. Interfaces would then have been gradually depleted in Co, which would have led to the same thermal stability characteristics being observed in Co/NiFe/Co/Ag multilayers as in NiFe/Ag multilayers. This phenomenon does not occur at all, or occurs very slightly, since as shown in FIGS. 2A and 2B, the thermal stability of the multilayer compound is increased by the addition of Co at interfaces. There must be some diffusion of Co in the Permalloy, but it must remain sufficiently limited so that the benefit on the thermal stability is not completely lost.

The example structures given in this document have been prepared by cathodic spraying. The basic vacuum in the production chamber was of the order of $2.10^{-8}$ mbars. Argon at a pressure of $1.5.10^{-3}$ mbars was used as spraying gas. The NiFe target was powered by an RF source, and the Co and Ag targets were powered by DC sources. Substrates were cooled while these materials were being deposited to a temperature of about the temperature of liquid nitrogen, to prevent coalescence of Ag layers. Other techniques could be used for making thin metallic layers in the preparation of these materials, for example epitaxy by molecular jet or spraying by ion beams.

A magnetic structure according to the invention may be used to make a current sensor like that described in application FR-2 710 753 (DD 1289).

Figure 5:
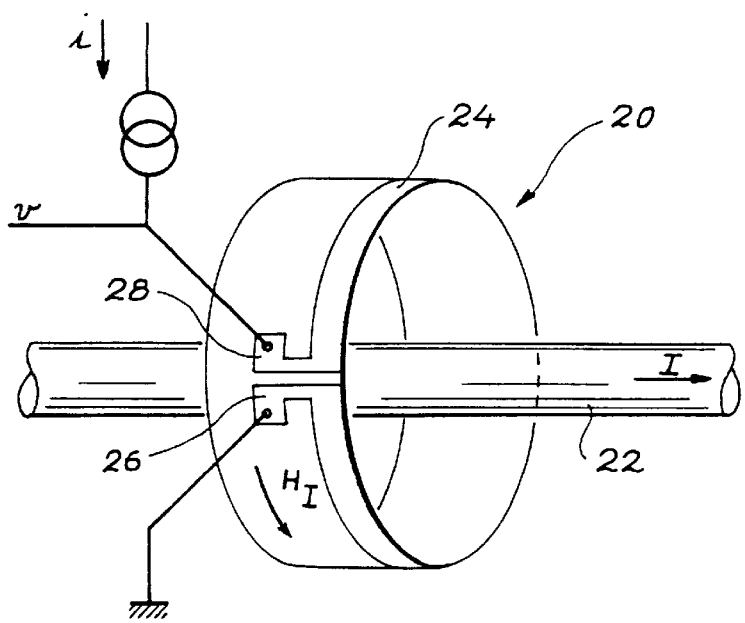

FIG. 5 shows this type of current sensor 20 in the position for measuring a current I passing through an electric conductor 22. The ring-shaped current sensor 20 contains a magnetoresistive tape 24 also in the shape of a ring. The ends 26 and 28 of tape 24 are placed close to each other, such that the tape forms an almost complete circle. These ends are laid out to allow electrical connection of tape 24 with a DC current (or voltage) generator i. Observing the voltage V at the terminals of tape 24 demonstrates the variation of the tape resistance under the effect of the magnetic field $H_I$ induced by the current I.

This same document also describes an electric circuit for measuring I. It also describes a process for making said sensor.

A magnetic structure according to the invention may also be used to make a magnetic head.

Figure 6:
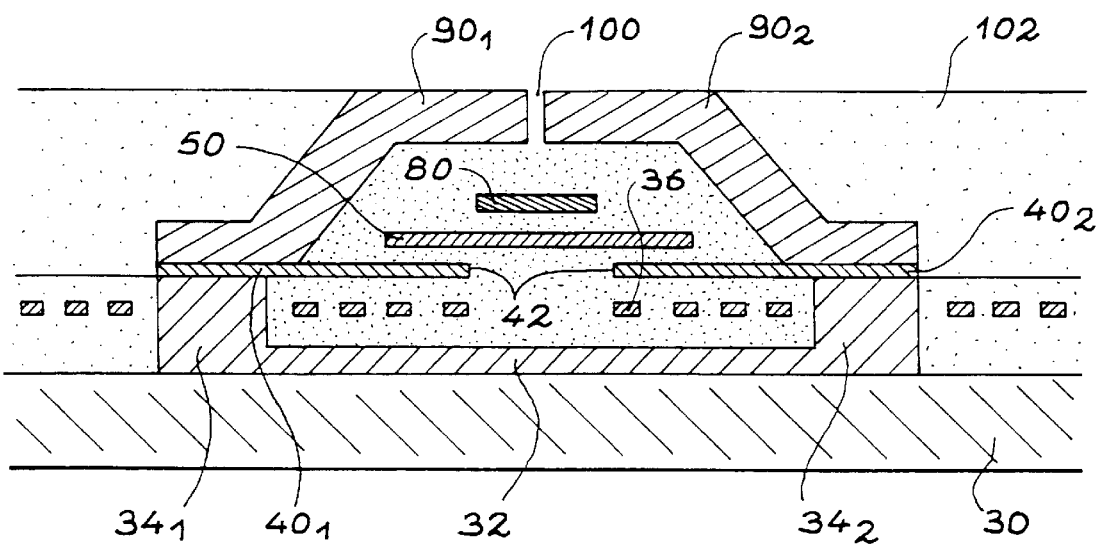
FIG. 6 shows an application of the invention to a magnetic write and/or read head.

FIG. 6 shows an illustration of how to use the invention in a magnetic write and/or read head. This type of head has been described in French patent application No. 93 13249 registered on Nov. 8, 1993.

The head is shown in section. It shows substrate 30, a lower magnetic layer 32, two magnetic stands 34$_1$, 34$_2$, a conducting winding 36, two magnetic parts 40$_1$, 40$_2$ forming a first air gap 42, a magnetoresistant multilayer element 50 placed above the air gap 42, a polarization conductor 80 through which a current passes perpendicular to the plane of the figure, two polar parts 90$_1$, 90$_2$ defining a second air gap 100 which is the air gap moving in front of the magnetic recording medium (not shown), everything being embedded in an insulator 102.

The current passing through conductor 80 can be adjusted to polarize the magnetoresistance 50 to an appropriate value.

In general, the main advantage of the invention is that it increases the stability of the structural properties of the material during annealing at temperatures varying from at least 250° C. to 300° C. to which the material may be subjected during lithographic processes. Furthermore, the addition of thin interface layers of Co, or Co rich alloys at the Permalloy/Ag interfaces can increase the magnetoresistance amplitude which, particularly in spin-valve structures, can increase the material sensitivity (increase of ΔR/R without a significant increase in the field variation necessary to observe the entire magnetoresistance amplitude).

We claim:

1. Multilayered magnetic structure including alternate stack of:
   layers based on magnetic materials,
   layers made of Ag or an Ag rich alloy,
   an interfacial layer of Co or a Co rich alloy being located at the interfaces between said layers based on magnetic materials and said layers made of Ag or an Ag rich alloy, said interfacial layer having a thickness less than 1 nm.

2. Magnetic structure according to claim 1, the formula for the magnetic material being:

$Ni_{100-x-y-z}Co_xFe_yA_z$ where $0 \leq x \leq 100$, $0 \leq y \leq 100$ and $0 \leq z \leq 40$ and $x+y+z \leq 100$, and wherein A is an additive.

3. Magnetic structure according to either of claims 1 or 2, the layers based on magnetic material being based on Permalloy.

4. Magnetic structure according to either of claims 1 or 2, the Ag rich alloy composition being $Ag_xCu_{1-x}$ or $Ag_xAu_{1-x}$ where $0<x<0.5$.

5. Multilayered magnetic structure according to either of claims 1 or 2, the thickness of said layers made of Ag or of an Ag rich alloy being such that there is an antiferromagnetic coupling between said layers based on magnetic materials through said layers made of Ag or an Ag rich alloy and the interface layers.

6. Multilayered magnetic structure according to claim 5, the thickness of said layers made of Ag or an Ag rich alloy being between 0.8 to 1.5 nm.

7. Multilayered magnetic structure according to either of claims 1 or 2, including two layers based on magnetic materials and one layer made of Ag or an Ag rich alloy.

8. Magnetic structure according to either of claims 1 or 2, comprising three layers based on magnetic materials and two layers made of Ag or an Ag rich alloy.

9. Multilayered magnetic structure according to claim 7, the layer made of an Ag or an Ag rich alloy having a thickness such that there is no antiferromagnetic coupling between the layers based on magnetic materials.

10. Multilayered magnetic structure according to claim 9, the layer made of Ag or an Ag rich alloy having a thickness of between 2 and 5 nm.

11. Magnetic structure according to claim 8, the layers made of an Ag or an Ag rich alloy having a thickness such that there is no antiferromagnetic coupling between the layers of the first type.

12. Multilayered magnetic structure according to claim 11, the layer made of Ag or an Ag rich alloy having a thickness of between 2 and 5 nm.

13. Magnetic structure according to claim 7, an antiferromagnetic layer being deposited on one of the layers based on magnetic materials.

14. Magnetic structure according to claim 8, an antiferromagnetic layer being deposited on one of the layers based on magnetic material.

15. Magnetic structure according to claim 13, the antiferromagnetic layer being made of FeMn and with a thickness of between 7 and 12 nm.

16. Process for making a multilayered magnetic structure including the following steps of:

depositing layers based on magnetic materials, depositing layers made of Ag or an Ag rich alloy, forming a thin interface layer of Co or a Co rich alloy at interfaces between said layers based on magnetic materials and said layers made of Ag or an Ag rich alloy.

17. Process according to claim 16, the layers being deposited by condensation of metal vapors on a substrate, at a temperature below the ambient temperature.

18. Process according to claim 17, the layers being made by cathodic spraying.

19. Multilayer sensor with magnetoresistive effect comprising a magnetic structure in layers according to either of claims 1 or 2.

20. Multilayer sensor with magnetoresistive effect comprising a magnetic structure in layers according to claim 7.

21. Multilayer sensor with magnetoresistive effect comprising a magnetic structure in layers according to claim 8.

22. Current sensor designed to measure the current passing through an electric conductor consisting of a magnetoresistive tape surrounding the conductor and the ends of which are designed to be connected to a current measurement device, the tape being composed of a layered magnetic structure according to claim 1 or 2.

23. Current sensor designed to measure the current passing through an electric conductor consisting of a magnetoresistive uape surrounding the conductor and the ends of which are designed to be connected to a current measurement device, the tape being composed of a layered magnetic structure according to claim 7.

24. Current sensor designed to measure the current passing through an electric conductor consisting of a magnetoresistive tape surrounding the conductor and the ends of which are designed to be connected to a current measurement device, the tape being composed of a layered magnetic structure according to claim 8.

25. Magnetic write and/or read head comprising a layered magnetoresistant element according to either of claims 1 or 2.

26. Magnetic write and/or read head comprising a layered magnetoresistant element according to claim 7.

27. Magnetic write and/or read head comprising a layered magnetoresistant element according to claim 8.

28. Multilayered magnetic structure according to claim 7, the layer made of an Ag or an Ag rich alloy having a thickness such that the antiferromagnetic coupling between the layers based on magnetic materials is less than $10^{-2}$ erg/cm$^2$.

29. Multilayered magnetic structure according to claim 8, the layer made of an Ag or an Ag rich alloy having a thickness such that the antiferromagnetic coupling between the layers based on magnetic materials is less than $10^{-2}$ erg/cm$^2$.

30. Magnetic structure according to claim 1, wherein A is at least one of Cu, Cr, Mo, V and B.

31. Magnetic Structure according to claim 14, the antiferromagnetic layer being made of FeMn and with a thickness of between 7 and 12 nm.

* * * * *

UNITED STATES PATENT AND TRADEMARK OFFICE
CERTIFICATE OF CORRECTION

PATENT NO. : 6,013,365
DATED : January 11, 2000
INVENTOR(S) : Bernard Dieny, et al..

It is certified that error appears in the above-identified patent and that said Letters Patent is hereby corrected as shown below:

On the Title Page, Item [73] the Assignee should read as follows:

[73] Assignee: Commissariat A L'Energie Atomique, Paris France

Signed and Sealed this

Twelfth Day of June, 2001

*Attest:*

*Attesting Officer*

NICHOLAS P. GODICI
*Acting Director of the United States Patent and Trademark Office*